United States Patent [19]

Gursky et al.

[11] 4,320,192
[45] Mar. 16, 1982

[54] ADJUSTING SUCCESSIVE STEPS FOR MAKING CARRIER TAPE

[75] Inventors: Michael T. Gursky; William W. Pcihoda, both of Lehigh County, Pa.

[73] Assignee: Western Electric Co., Inc., New York, N.Y.

[21] Appl. No.: 141,434

[22] Filed: Apr. 17, 1980

Related U.S. Application Data

[62] Division of Ser. No. 8,621, Feb. 1, 1979, Pat. No. 4,227,983.

[51] Int. Cl.³ ............................................... H05K 3/00
[52] U.S. Cl. .................................... 430/323; 156/640; 156/345; 156/664; 430/329; 430/312; 430/318; 226/1; 226/8
[58] Field of Search ............... 430/323, 329, 312, 318; 156/640, 345, 664; 226/1, 8

[56] References Cited

U.S. PATENT DOCUMENTS

| | | | |
|---|---|---|---|
| 2,671,034 | 3/1954 | Steinfeld | 427/127 |
| 3,119,534 | 1/1964 | Lehnert | 226/1 |
| 3,763,404 | 10/1973 | Aird | 174/52 PE |
| 3,929,551 | 12/1975 | Frantzen | 156/345 |
| 3,960,561 | 6/1976 | Haining | 428/96 |
| 3,968,563 | 7/1976 | Hamlin | 357/70 |
| 4,011,123 | 3/1977 | Buysman | 156/640 |
| 4,013,498 | 3/1977 | Frantzen | 156/345 |
| 4,015,987 | 4/1977 | Garry | 156/644 |
| 4,049,903 | 9/1977 | Kobler | 29/589 |
| 4,051,274 | 9/1977 | Hata | 427/96 |
| 4,057,459 | 11/1977 | Mitterhummer | 156/630 |
| 4,063,993 | 12/1977 | Burns | 156/644 |
| 4,089,733 | 5/1978 | Zimmerman | 156/630 |
| 4,124,437 | 11/1978 | Bond et al. | 156/640 |

*Primary Examiner*—John D. Smith
*Attorney, Agent, or Firm*—D. C. Watson; G. W. Houseweart

[57] ABSTRACT

A strip 20 has a drive margin 36 and a latent image of a pattern in a light sensitive coating 73 of a pattern portion 22 thereon. To avoid disturbing the pattern, the strip 20 is gripped by the drive margin 36 using a set 43 of pinch-drive rollers which drive the strip without disturbing the latent image. The strip 20 is driven through pattern development, cleaning and etching solution spray chambers 64, 66 and 108, respectively. One or more adjustable shields 78 are used to vary the time interval during which the strip 20 is sprayed by these solutions. By adjusting one or more shields 78 to suit changes in solution condition the time intervals for proper developing, cleaning and etching are coordinated for a speed at which the strip 20 is driven.

10 Claims, 14 Drawing Figures

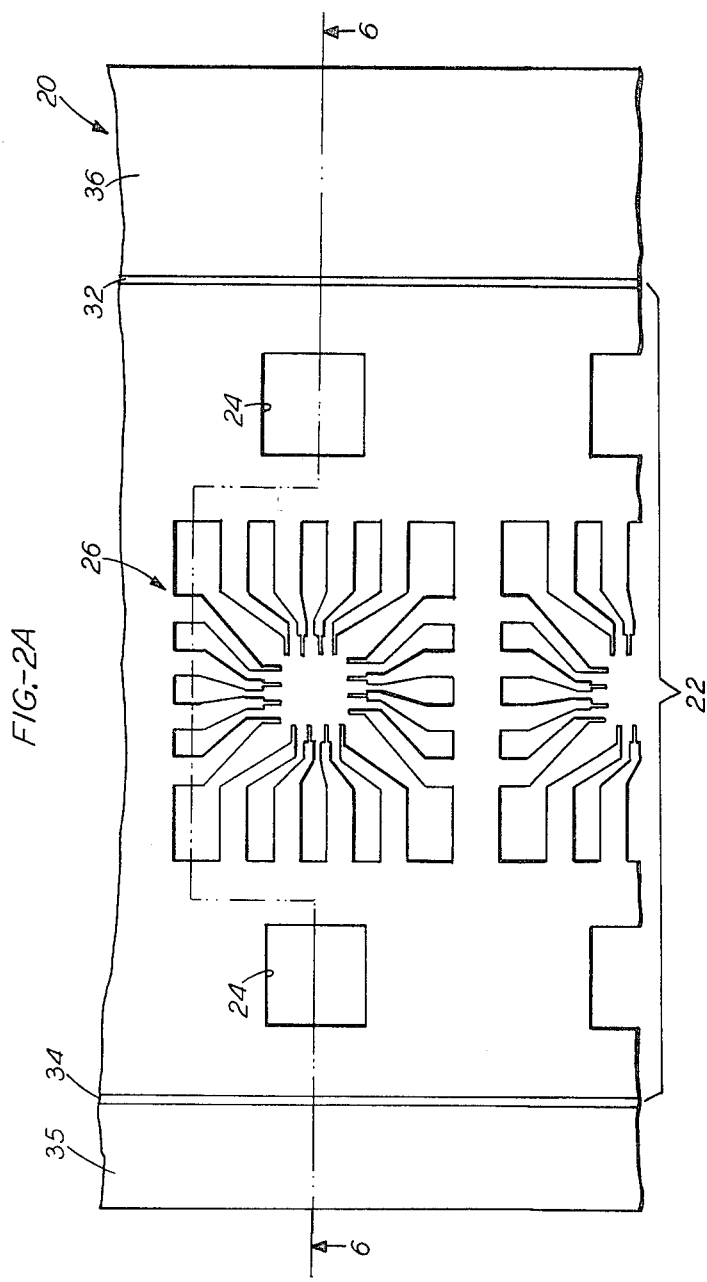

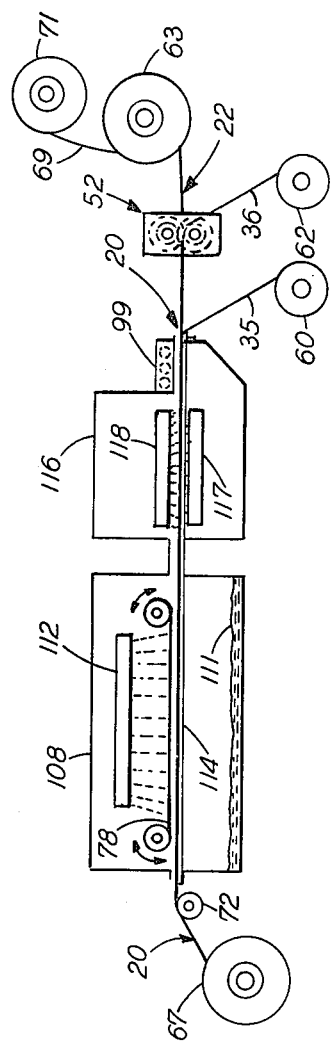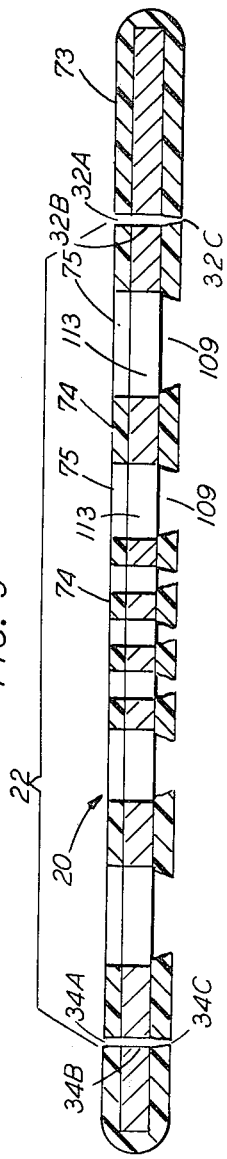

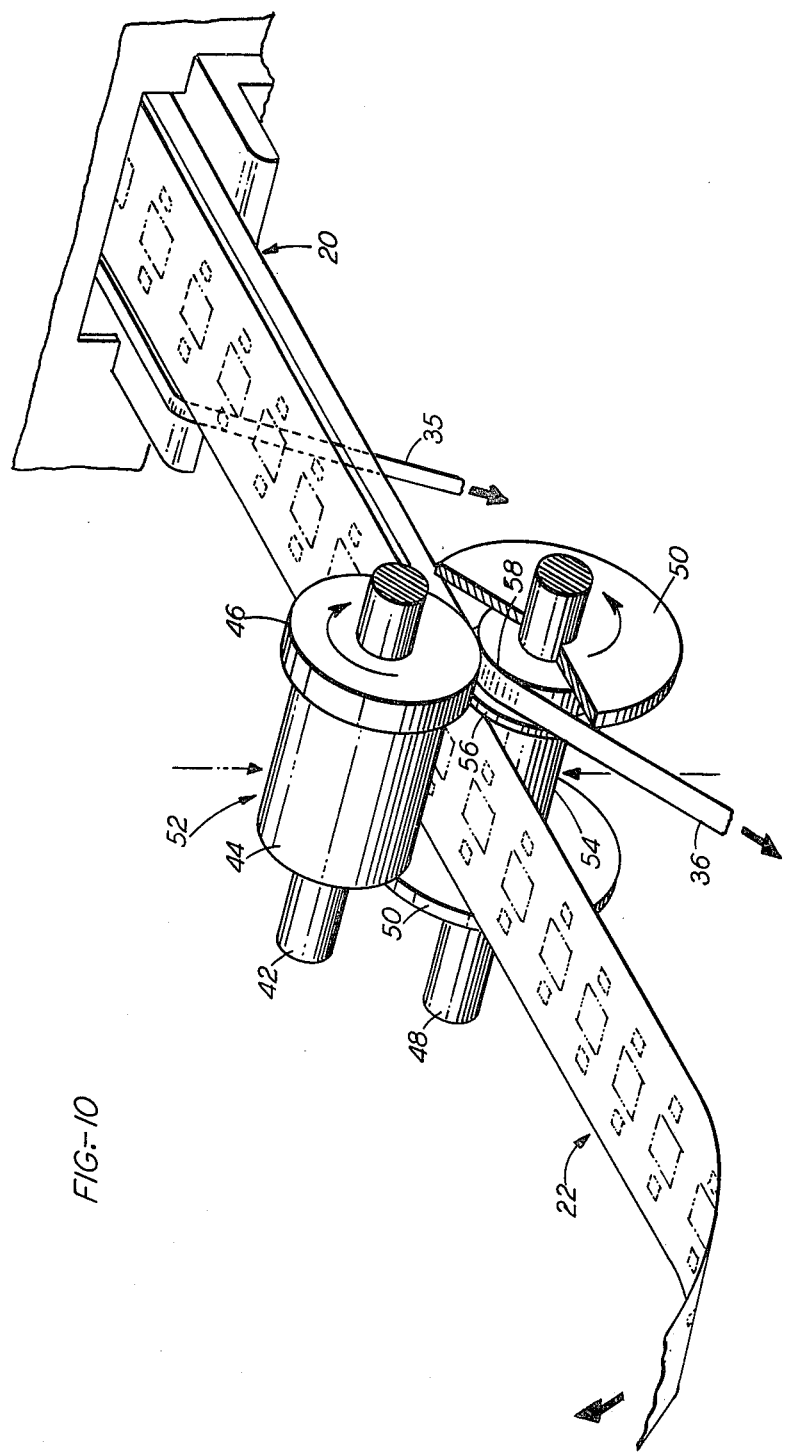

ADJUSTING SUCCESSIVE STEPS FOR MAKING CARRIER TAPE

This is a division of application Ser. No. 8,621, filed Feb. 1, 1979 now U.S. Pat. No. 4,227,983.

TECHNICAL FIELD

This invention relates to methods and apparatus for making carrier tape used in the semiconductor industry. More particularly, the invention relates to forming patterns into long strips of delicate copper foil using light sensitive coatings and photolithographic techniques to obtain accurate and sharp lines in the patterns. The invention further relates to continuous developing, cleaning and etching steps used to completely form the pattern through the copper foil to make carrier tape.

BACKGROUND OF THE INVENTION

Thin ribbons of specially patterned metal foil, called carrier tapes, are used in the semiconductor industry to handle very small and fragile components such as integrated circuit chips. The chips are bonded to the tape which moves and carries the chips until they are later incorporated into subassemblies. The tape also provides leads to bondably connect the chips to the subassemblies.

Carrier tapes typically include at least a conductive material such as copper sheet out of which the leads are formed. Preferably, the copper sheet is very thin to later enhance bonding so that completed devices can later endure temperature cycling tests.

High conductivity copper foil of very high quality is generally used to make such tape. The foil is typically 0.0178 m.m. to 0.071 m.m. in thickness and is annealed to obtain "dead soft" ductility. Foil of this type is very delicate and requires careful handling. Without such care, it will become wrinkled, warped or otherwise distorted as it is wound upon reels or indexed for device assembly.

The leads formed in the copper foil are typically arranged in clusters with 8 to 32 finger-like leads per cluster. Typical dimensions are such that a tape may yield in the range of 64 clusters per lineal foot for bonding chips thereto.

Each lead should be accurately placed to within about 0.0025 m.m. of its desired position and each edge must be sharp and carefully delineated. Otherwise, registration of leads-to-bonding pads or of leads-to-leads will be affected during bonding operations. Registration is also affected by the way indexing is accomplished. Therefore, close tolerance perforations typically are provided in the tape to accommodate sprocket teeth used to engage and index the tape.

The fine and precise linework required to form such a tape is conventionally accomplished reliably and reproducibly using photolithographic techniques. A master mask is prepared with the utmost precision, typically using a laser machine system controlled by a computer. The mask is used repeatedly to obtain exact line location, sharp and clean line definition and excellent reproducibility of images formed by the mask.

The copper strip is first cleaned and then coated with a light-sensitive coating, such coating being normally resistant to etchants. The coated strip is then positioned into a spaced relationship with the master mask through which the coating is selectively exposed to intense ultraviolet light to form a latent image of a desired pattern in the etchant-resistant coating. Then the pattern is formed into the strip without downgrading the quality of the foil, without destroying its dimensional integrity and without degrading the precision of the linework in the pattern.

Forming the pattern in the strip generally includes the steps of developing the latent image of the pattern in the coating, cleaning the image to make it clearly patent and etching away unwanted areas of copper foil not protected by the etchant-resistant outline of the image in the coating to complete the pattern. Economics of manufacture dictate that these forming steps be performed substantially simultaneously as the strip is driven through a succession of such forming steps.

Prior art methods of driving a strip such as that disclosed in U.S. Pat. No. 4,013,498 to J. J. Frantzen et al. employ spools, reels and guides which apply pressure to the entire width of surface both above and below the strip. Generally the strip is freely suspended as it passes through solution spray chambers and the spray impinges upon the strip from the top or bottom of the chamber. When such methods are used to grip and drive the strip described herein a risk is taken because the gripping pressures tend to damage the coating and distort or otherwise degrade the latent image therein. Furthermore, the tension required to suspend the strip sufficient to withstand the spray impingement forces is not reliably endured by the low strength of the delicate copper foil.

It is, therefore, desirable to have methods and apparatus to grip and drive the strip without disturbing the latent image of the pattern in the strip. Furthermore, it is desirable to form the pattern in the coating on the strip without impinging solution sprays upon suspended portions of the strip.

The developing, cleaning and etching steps also pose many problems when tried in a successive and continuous manner on the constantly moving strip such as the strip described herein. Each spray solution used in these steps contains different chemicals having reaction time intervals which are also usually different. Further, it is desirable to conserve these solutions by recirculating and reusing them. Yet such reuse of solution causes reaction chemicals to be depleted and impurities to build up in the solution. Thus, the rates of chemical reaction are affected by such reuse of solution.

It is, therefore, desirable in the successive and continuous forming steps to coordinate and adjust the time intervals during which the pattern is exposed to the solution sprays at each step. It is also desirable to adjust each time interval from time-to-time as each solution becomes depleted of its chemicals or contaminated with impurities. Furthermore, it is desirable to make these adjustments without expensive electrical or mechanical controls such as spray valves, timers, switches or variable-speed drive mechanisms.

SUMMARY OF THE INVENTION

In view of the foregoing, it is an object of this invention to provide improved methods and apparatus for making carrier tape.

With this and other objects in mind, the present invention includes the steps of successively gripping a continuous strip along a drive portion thereof and driving the strip in a lengthwise direction. A pattern is formed in a portion of the strip separate from the drive portion. Then the pattern portion is separated from the drive portion of the strip, the pattern portion being usable for carrier tape.

A method of forming a pattern for making carrier tape in accordance with one embodiment of this invention includes the steps of forming the pattern in a pattern portion of a strip by successively gripping the strip along a drive margin portion and driving the strip in a lengthwise direction without disturbing the latent image thereon. The strip is guided through a succession of pattern forming steps, each step requiring a separate time interval for such forming. The strip is shielded at one or more of the forming steps whereby the pattern portion of the strip is exposed for a respective time interval suitable for the respective forming step.

In a particular embodiment of the invention, the margin portion of the strip being gripped for driving is of sufficient strength in relation to the pattern portion that any driving stresses transmitted to the pattern are insufficient to distort the pattern portion of the strip.

In another embodiment of the invention, a delicate metal foil strip is coated with a light-sensitive material and the latent image is formed in the coating. Further forming steps include developing the latent image to make it patent and cleaning the image of the pattern on the strip. The exposure time interval for developing is often different from the exposure time interval for cleaning the pattern at a tape speed suitable for cleaning, so a shield is used to obtain the suitable time interval for development.

In a further embodiment of the invention, forming the pattern includes removing unwanted areas in the strip by etching away those areas using the outline of the pattern portion as a mask. The strip is then rinsed, dried and wound upon a spool. The forming steps are done substantially simultaneously along successive portions of the strip and a shield is used at the etching step so that the pattern is exposed for etching away the unwanted areas for a time interval suitable for such etching.

In a specific embodiment of the invention, one or more sets of supports and rollers are used for supporting the strip and for guiding the strip successively through a developer spray chamber, a rinsing and drying chamber, an etching chamber, and another rinsing and drying chamber. A set of pinch-drive rollers are used to successively grip the strip along the drive margin to drive the strip, to clear the margins and to separate the strip into one or more smaller strips containing pattern portions. Each smaller strip is then wound upon one or more spools including a protective film interleaved between layers of the pattern portion as each smaller strip is wound upon each spool.

One or more shields are used in one or more of the spray chambers, each shield comprising a sheet of material overlying and wider than the driven strip and having a longitudinal opening also wider than the strip. An edge of the opening in the shield is on a line normal to the strip, and exposes the pattern uniformly to the respective forming step.

Advantageously, the sheet is disposed between two spools which can be rotated to vary the length of the opening and thereby to vary the exposure time interval as the strip is driven past the opening.

BRIEF DESCRIPTION OF THE DRAWING

Other objects and aspects of the invention will be more readily understood from the following detailed description thereof when read in conjunction with the accompanying drawing, wherein:

FIG. 2A is a plan view of a section of a strip of metal foil having a single row pattern formed therein in accordance with the present invention;

FIG. 8 is an elevational view, drawn schematically of a succession of chambers, rollers and spools with a strip being driven therethrough for etching, rinsing, drying and interleaving the strip in accordance with the present invention;

FIG. 9 is the same view as FIG. 6 but showing a pattern in a strip after unwanted areas in the strip have been etched away; and FIG. 10 is a pictorial view of a strip being driven by a set of pinch-drive rollers and further showing two margins being separated from a pattern portion of the strip, in accordance with the present invention.

It will be seen that the figures are not necessarily drawn to scale. Also, where appropriate, the same reference numerals have been repeated in various figures to designate corresponding features.

DETAILED DESCRIPTION

Figure 1:
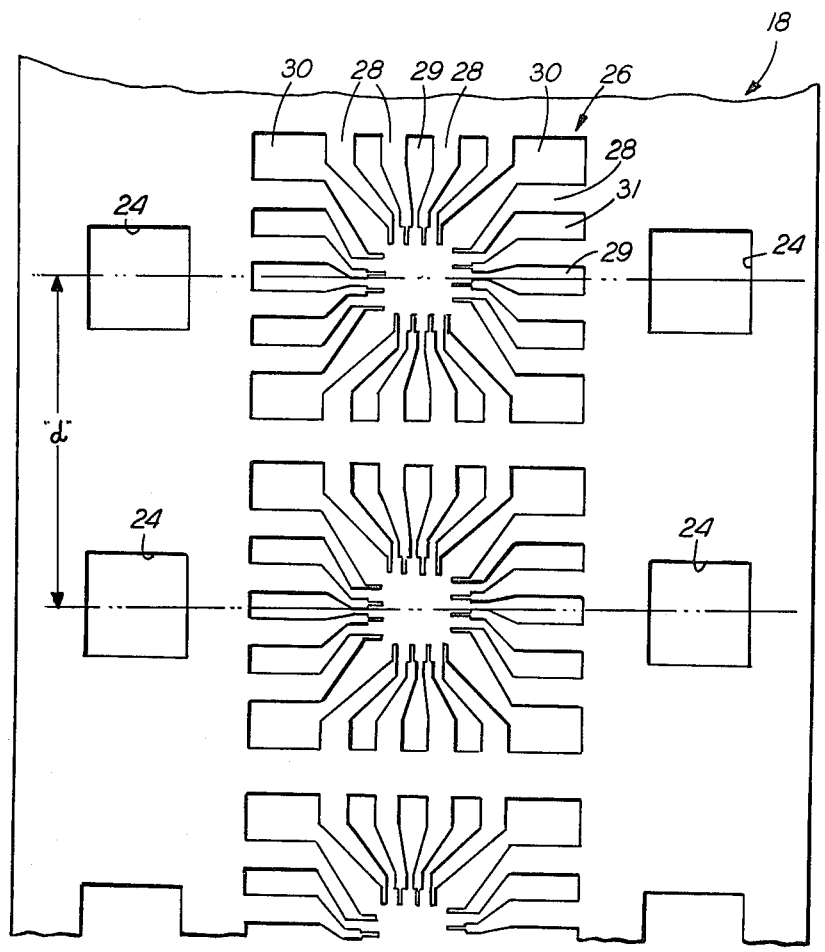
FIG. 1 is a plan view of a section of a typical carrier tape with a typical pattern formed therein.

Referring to FIG. 1, a plan view is shown of a section of a typical carrier tape 18 having a typical pattern formed therein in accordance with the present invention. The pattern includes a row of lead clusters 26 running lengthwise of tape 18 and two rows, also running lengthwise, containing sprocket perforations 24.

Finger-like leads 28, called "inner" leads, are shown with free ends projecting toward the center of each cluster 26 and with opposite ends fixed to the tape 18. A center portion of each cluster 26 is open to accept a chip (not shown) which has bonding pads, each of which corresponds to each free end of the leads 28. In each cluster 26 there are 16 free ends of the leads 28 which will be bonded to 16 pads on the chip. The tape will then carry the chip until the fixed ends of the leads 28 are sheared out of each cluster 26 and bonded to stiff "outer" leads (not shown) for ultimate insertion into circuit packs.

The square perforations 24 are located symmetrically about the transverse centerline of each lead cluster 26. The perforations 24 are designed to accommodate sprocket teeth such as those found on drive wheels which are used to advance motion picture film. The distance "d" between successive perforations measured along the centerline of the tape equals the pitch of sprocket teeth which will engage and index the tape during device assembly.

The perforations 24 and the lead clusters 26 are the major features of the pattern which is formed into sheet material to make the carrier tape 18. Each line of the pattern is formed with clean edges and precise line definition. It is also important that the lead outlines be accurately placed within the pattern typically to an accuracy of ±0.0025 m.m. of a desired placement. Such line definition and placement accuracy are required for proper lead registration to chip pads or to outer leads for successful bonding; it is also required to avoid short circuiting across leads when a lead cluster carrying a chip is deformed out of the plane of the tape 18 at outer lead bonding.

It will be appreciated that other patterns containing different lead clusters are also formed into sheet material to make carrier tape. Quantities of such leads now range from 8–40 leads per cluster. The leads 28 in the clusters 26 shown in FIG. 1 are typically so compact that the clusters 26 are only about 4.0 m.m. square. The clusters 26 are so closely spaced that the tape typically yields 64 clusters per lineal foot of tape leaving a distance of only about 0.7 to 0.8 m.m. between clusters. Other tapes have similarly sized clusters typically spaced 3.2 m.m. to 9.5 m.m. apart yielding less clusters per lineal foot of tape. For more intensive use such carrier tape can be made wider and have as many as 3 rows of lead clusters, typically yielding up to 192 clusters per lineal foot of tape.

Tape 18 is advantageously formed out of sheet material made of oxygen-free, high-conductivity copper. The copper sheet is generally referred to as "foil" because it is preferably only from 0.018 m.m. to 0.071 m.m. in thickness, weighing from 0.023 to 0.076 grams per square centimeter.

For the sake of clarity we will generally designate the elongated sheet of material as "strip" or as "a continuous member" realizing that such strip can be of different width depending upon the tape being made and the stage of forming at which reference is made to the strip.

Before it is used to make tape, the foil strip is annealed to obtain "dead soft" ductility. Foil of such ductility is of low tensile strength and has little resistance to bending, wrinkling and distortion. Certain areas of sheet such as unwanted areas 24, 29, 30, and 31, shown in FIG. 1, are removed when the pattern is formed through copper foil strip to make the tape 18. It will be appreciated that the resulting strip is significantly weakened during and after such forming, particularly in the pattern portion of the strip.

To overcome this problem, tape 18 is made, in accordance with the present invention, starting with wider foil such as a strip 20 shown in FIG. 2A. Note in FIG. 2A, that a wide margin 36 is provided to grip and drive the strip 20 and another margin 35 is provided, when needed, to delineate the other edge of a row of lead clusters 26. A line 32 and a line 34 are provided lengthwise of the tape for the purpose of separating the margins 35 and 36 from the row of lead clusters 26 when the usefulness of the margins has ended.

The lines 32 and 34, the lead clusters 26 and sprocket perforations 24 comprise a pattern portion 22 of the strip 20. It will be appreciated that the pattern portion 22, when completed, will be usable as carrier tape such as the tape 18 shown in FIG. 1. Of course, for some carrier tapes it will be necessary to plate at least some parts of pattern portion 22. For example, the pattern portion which becomes usable as tape 18 typically receives about 0.0008 m.m. thickness of gold plating on the lead areas to minimize service corrosion of bonded connections.

The drive margin 36 must be of sufficient strength relative to the pattern portion 22 of the strip 20 so that any driving stresses which are transmitted to the pattern portion 22 are insufficient to distort that portion of the strip 20. In the strip 20 shown in FIG. 2A an 11 m.m. wide pattern portion 22 is formed out of a 16 m.m. wide strip of foil. An acceptable width for the drive margin 36 is found to be in the range of 3–4 m.m. leaving 1–2 m.m., when needed, for the delineating margin 35. Thus an acceptable ratio of drive margin width to pattern portion width is found to be about 3.5:11 for the strip 20 and the pattern shown in FIG. 2A.

Figure 2B:
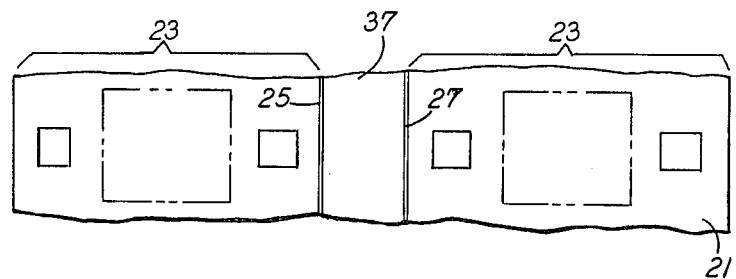
FIG. 2B is a plan view of a section of a strip having multiple rows of patterns with a nonmarginal drive portion formed therein in accordance with the present invention.

While these dimensions and the ratio given are found to be suitable for the arrangement shown in FIG. 2A it will be appreciated that other dimensions and ratios can be used to make other tapes having other patterns using a drive portion concept. In particular, it is believed to be quite practical to provide a sheet of foil such as a strip 21 shown in FIG. 2B to make carrier tape. Here two identical pattern portions 23 are shown with a drive portion 37 in about the center of the strip 21 separated by a line 25 and a line 27. A desirable advantage obtained by this arrangement is the symmetry of the layout and the balanced driving stresses which are transmitted throughout strip 21. The dimensions of the strip 21, of the pattern portions 23 and of the drive portion 37 can be varied to suit the dimensions of the carrier tape desired.

Carrier tapes of 11, 14, 19 and 35 m.m. widths are typically made from foil strips which are from 16 to 44.45 m.m. in width. For example in a foil strip 44.45 m.m. wide, three rows of 11 m.m. tape, two rows of 14 m.m. tape or one row of 35 m.m. tape can typically be made using the present invention. Generally, lines running lengthwise of the foil strip are etched about 0.25 m.m. in width to separate the drive portions from the pattern portions in making the tape.

Figure 3:
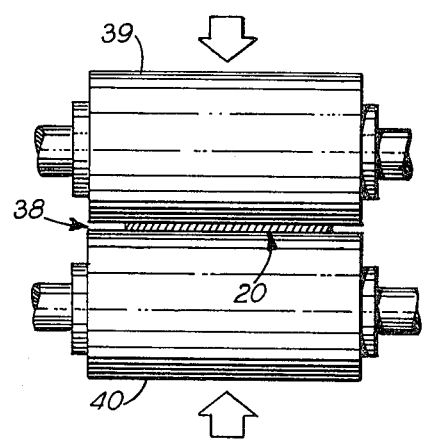
FIG. 3 is an elevational view of a set of full grip rollers used in the prior art to grip and drive a strip.

The method and apparatus for gripping and driving foil such as the strip 20 can best be described by reference to FIG. 3, FIG. 4A and FIG. 4B. An elevational view is shown in FIG. 3 of a prior art, full-gripping set 38 of rollers. Note that the strip 20 is disposed between an upper drive roller 39 and a lower drive roller 40. While it is being driven, the strip 20 is fully gripped along its entire width by compression applied according to the arrows shown. Such compression is normally not deleterious to most strips of foil and indeed is not deleterious to strips coated with very thin photoresist coatings if the thickness is in the range of 2 to 3 microns.

However, where coatings are thick or where they are not uniformly applied so that random build up of coating thickness occurs, the compression can extrude coating in pattern areas and distort images in the coating. Further, it is important in an etching step to avoid disturbing a pattern because it becomes weakened during etching by removal of unwanted areas of copper foil.

Figure 4A:
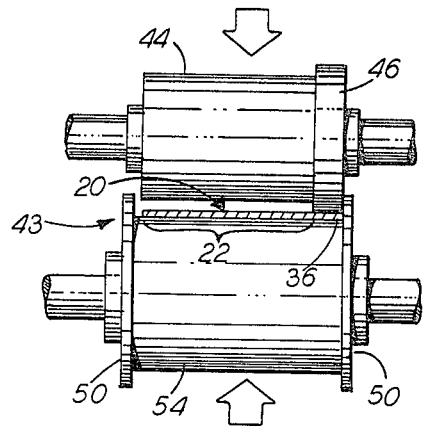
FIG. 4A is an elevational view of a set of pinch-drive rollers which grip only a drive margin to drive a strip in accordance with the present invention.

To avoid disturbing the pattern portion 22 of the strip 20 shown in FIG. 2A a set 43 of pinch-drive rollers 44 and 54 are used as shown in FIG. 4A. The bottom roller 54 has a pair of flanges 50 which align the strip 20 so that it can be properly gripped. The top roller 44 has a raised shoulder 46 of a width suitable to grip the drive margin 36 of the strip 20. Note that the strip 20 is substantially disposed upon the full drum surface of the roller 54 but it is only gripped by the raised shoulder 46 of the roller 44 in the drive margin portion 36 of the strip 20. In FIG. 4B there is shown another set 41 of grip-drive rollers 45 and 47. Note that a raised portion 49 of the roller 45 is located about the center portion of the roller 45 to grip a central part of a strip such as the drive portion 37 of the strip 21 shown in FIG. 2B.

Figure 4B:
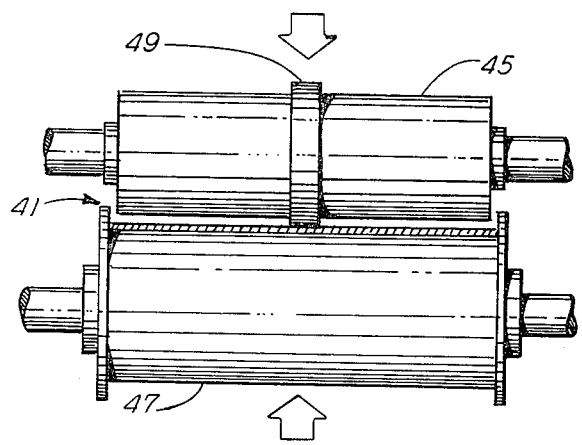
FIG. 4B is an elevational view of a set of pinch-drive rollers which grip a nonmarginal portion to drive a strip in accordance with the present invention.

Of course, the top and bottom rollers of sets 38, 43 and 41 as shown in FIGS. 3, 4A and 4B, are counter-rotated to drive either the strip 20 or the strip 21 therebetween. It will also be appreciated that driving a strip generally includes the function of pulling or otherwise advancing a strip in a lengthwise direction thereby.

It will be further appreciated that various sets 38 of prior art, full-grip rollers and/or sets 41 or 43 of pinch-drive rollers of the present invention can be used in cooperation along the length of a strip depending upon the susceptibility of pattern portions to distortion at each step in the forming of a pattern. However, the pinch-drive sets 41 or 43 are preferably used because they do not risk damage to such pattern portions. Furthermore, it is highly advantageous to use the sets 41 or 43 of pinch-drive rollers to pull a foil strip through an etching step because the foil strip is then etched apart into one or more pattern portions and one or more margins at such etching step. Furthermore, the delicate clusters of leads in the pattern portions of such strip are highly susceptible to damage during and after etching.

The strip 20 shown in FIG. 2A is typically coated top and bottom with a suitable photoresist coating which is then baked onto the strip 20 in an oven at about 85° C. One example of such a suitable coating material is available from the Shipley Co., Inc., Newton, Mass., sold under the trade designation "Shipley AZ-340B."

An image of a desired pattern is then precisely formed into the coating by photolithographic methods. A strong, intense ultraviolet light is passed through a master mask and directed upon the coating. Those portions of coating exposed to the light are polymerized making such coating much more soluble in a special alkaline developing solution than the unexposed portions which remain unpolymerized. The image formed thereby is invisible to the naked eye and is thus considered latent until it is developed and made patent upon the strip.

One example of a chemical which is suitable to develop a latent image of a pattern is available from the Shipley Co., Inc., sold under the trade designation "Shipley 303A." Such chemical is generally mixed with three equal parts of pure water to obtain a solution which can be reused for a given time and a given amount of development work.

Figure 5:
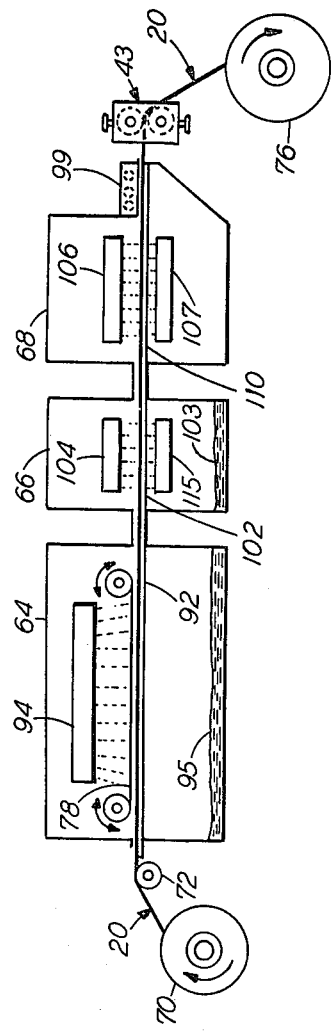
FIG. 5 is an elevational view, drawn schematically, of a succession of chambers, rollers and spools with a strip being driven therethrough for developing, cleaning, rinsing and drying the strip in accordance with the present invention.

Referring to FIG. 5 there is shown in schematic an elevational view of a typical, continuous developing operation. A reel 70 supplies a strip such as strip 20 having a latent image of a pattern in a coating thereon. The strip 20 is guided by a guide roller 72 into and through a developing spray chamber 64. The strip 20 is supported by a support bridge 92 to resist the forces of a developer spray issuing from a spray manifold 94. A shield 78 has an opening (not shown) through which the developing spray impinges upon the strip 20 as it passes under the opening. The pattern in the coating on the strip is exposed to the developer spray for a time interval which depends upon the strip speed and the length of the opening.

The developer chemical, generally mixed with water, forms a solution 95 which is typically poured into a tank (not shown) in the bottom of chamber 64. The solution 95 is then pumped into the spray manifold 94 from which it is sprayed upon the moving strip 20. The solution 95 is caught in the bottom of the chamber 64 and is then recirculated through the spray manifold 94.

The time interval needed for the developer spray solution 95 to suitably develop any given area on the strip 20 can typically vary from 0.5 minutes to 4.0 minutes. This interval is usually dependent upon the chemical content of the solution 95 and the amount of impurity contained therein after the solution has been recirculated and reused for a given length of time. Generally a time interval of about 2.5 minutes had been found suitable when reasonably fresh developer solution is used in practicing the present invention.

Figure 6:
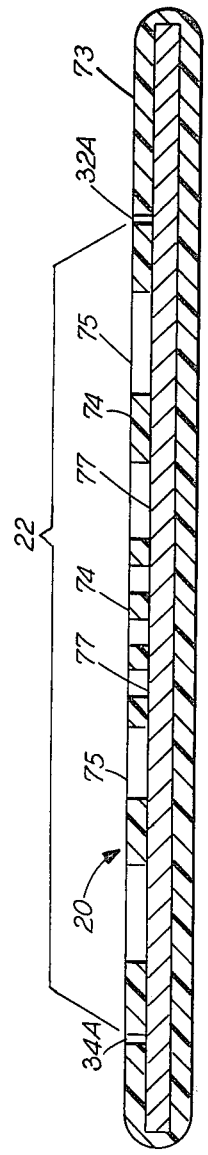
FIG. 6 is a cross-sectional view taken along line 6—6 in FIG. 2A showing a strip after a latent image of a pattern has been developed in a coating thereon in accordance with the present invention.

FIG. 6 is a cross-sectional view of a strip such as the strip 20, shown in FIG. 5 after developing a pattern in a coating 73 thereon. Strip 20 is provided with a coating 73 applied over all surfaces of the strip and with a latent image of the pattern formed therein before being wound upon the reel 70 shown in FIG. 5. After development the polymerized coating in unwanted areas within the pattern such as in areas 75 have been substantially removed thus exposing the surface of copper foil as shown in areas 77. Unpolymerized areas of coating as shown in areas 74 within the pattern portion 22 of the strip 20 are only slightly attacked by the developer chemicals.

After strip 20 exits chamber 64 in FIG. 5 it is guided over an open support 102 in a cleaning chamber 66. The open support 102 is designed very much like a ladder disposed in a horizontal position; it supports the tape, yet it allows a maximum amount of solution to pass therethrough. A cleaning solution 103 contains an acid which is preferably A.C.S. grade hydrochloric acid in relatively pure water. The solution 103 gathers in a tank (not shown) in the bottom of the chamber 66 and is recirculated through a top spray manifold 104 and a bottom spray manifold 115. The strip 20 is thus wetted top and bottom with the solution 103 as it is sprayed onto strip 20 from the said spray manifolds 104 and 115.

The strip 20 typically travels at a speed suitable for the cleaning operation in the chamber 66. Such cleaning includes stopping the development by neutralizing the alkaline developer chemicals. It also includes loosening particles of coating within the areas 77 by slightly etching the copper surfaces and cleaning all areas to make the pattern clearly patent upon the strip 20.

After the strip 20 exits the cleaning chamber 66 it is guided over an open support 110 in a rinsing and drying chamber 68. The open support 110 is similar in design and function to the open support 102 mentioned above but it typically is of different dimensions to suit the chamber 68. In the rinsing section of chamber 68, relatively pure water is sprayed from a manifold 106 and a manifold 107 upon the top and bottom of the strip 20. Then forced air from a tube section 99 impinges upon and dries the strip 20.

A pinch-drive roller set 43 is shown disposed about the strip 20 at an outlet of the drying section 99 of the chamber 68. Such roller set can be of the full grip type 38, as shown in FIG. 3, if the pattern on the strip 20 is not likely to be distorted. However, if the coating in the pattern portion is susceptible to distortion, then a set 43 of pinch-drive rollers as shown in FIG. 4A is advantageously used to drive the strip 20 by gripping only a drive margin thereof.

A reel 76 is provided and driven by a very low, friction-torque motor to take up the strip 20 for storage. The feeder reel 70 is advantageously provided with a light drag to keep the strip 20 taut and unwrinkled as it passes through the chambers 64, 66 and 68. Also, additional drive roller sets 43 can be used at various points such as, for example, between each chamber if better drive control is required.

Figure 7A:
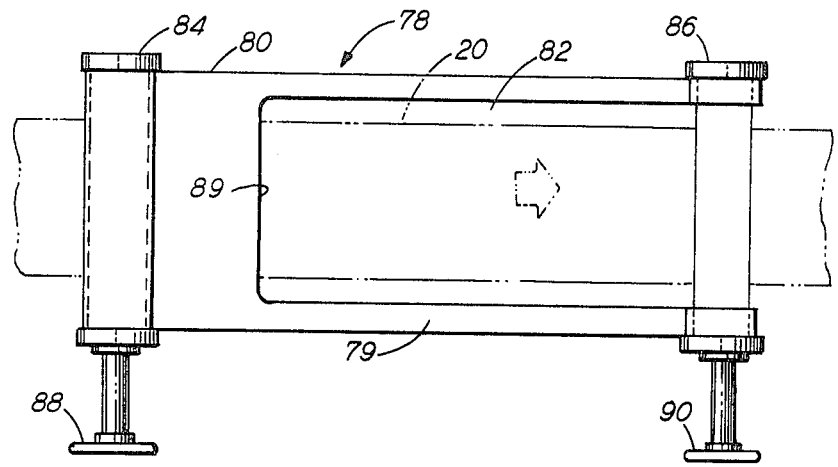
FIG. 7A is a pictorial view of a shield disposed between two rotatable spools, the shield having a rectangular opening, in accordance with an embodiment of the present invention.

Referring to FIG. 7A, there is shown one example of a particular shield 78 useful in the developing chamber 64. A sheet 80 of material is provided which is flexible and which is unaffected by the chemicals in the spray solution. The sheet 80 is shown disposed symmetrically about the longitudinal centerline of the strip 20. The sheet 80 overlies and shields only one side of the strip 20. The strip 20 is adapted to move in the direction shown toward the righthand side of the figure.

The sheet 80 is also disposed between a spool 84 and another spool 86. The free ends of the sheet 80 are wound in opposite directions upon the spools 84 and 86. The sheet 80 has a rectangular opening 82 which is wider than the driven strip 20 and which extends from the spool 86 at the righthand side of the figure toward the lefthand side of the figure. The opening 82 ends at an edge 89 which is on a line normal to the centerline of the strip 20. By rotating the spools 84 and 86 in the same direction, a pair of sheet pull sections 79 are taken up or let out by spool 86 and the rectangular opening 82 can be made longer or shorter. Thus the moving strip 20 is exposed to solution sprays for a longer or shorter time interval by adjusting the shield 78 accordingly.

There are several advantageous features to be noticed about the shield 78. By reference to FIG. 5 it can be seen that the shield 78 can fit totally within the developer chamber 64. By this arrangement there are no chamber openings requiring seals which are often difficult to maintain. The shield 78 is very simple in construction and inexpensive to provide; it is also easily adjusted to suit changes in chemical reaction time. Generally such changes take place slowly so that the chamber 64 can be opened to make such adjustments. However, by a simple modification, a rotatable means such as a pair of wheels 88 and 90 can be provided which extend through the chamber walls to permit adjustments even while spraying continues. Note that the wheels 88 and 90 are attached to the pair of spools 84 and 86 by round shafts which are easily provided with seals where such shafts protrude through the walls of spray chambers.

Figure 7B:
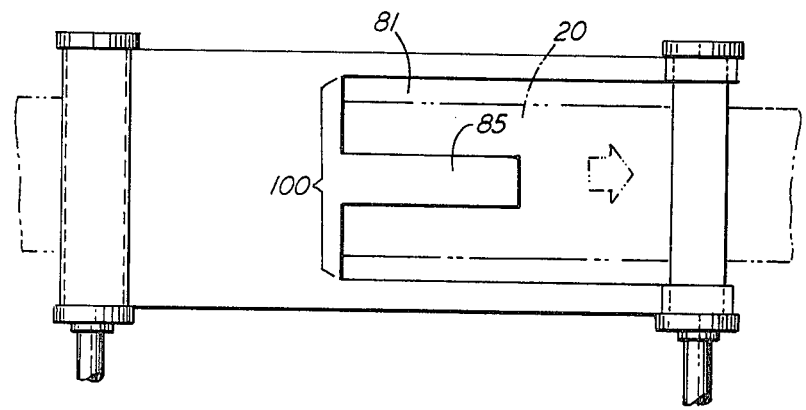
FIG. 7B is the same view as FIG. 7A but showing a shield with one embodiment of an opening for exposure of a strip in a nonuniform manner along a line transverse to its centerline in accordance with the present invention.
Figure 7C:
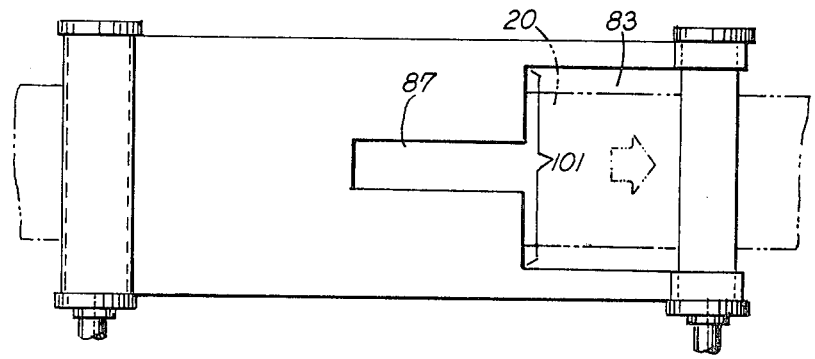
FIG. 7C is the same view as FIG. 7A but showing a shield with another embodiment of an opening for exposure of a strip in a nonuniform manner along a line transverse to its centerline in accordance with the present invention.

FIGS. 7B and 7C illustrate alternate embodiments of the shield 78. In particular, the openings have different outlines than the opening 82. In FIG. 7B an opening 81 has a left side edge 100 crossing the strip 20 on a nonuniform line so that a center portion 85 of the shield overlies more of the central portion of the strip 20 which portion is thus unprotected for a shorter time interval than noncentral portions of the strip 20. In FIG. 7C an opening 83 has a left side edge 101 crossing the strip 20 on a nonuniform line. Thus the center portion of the strip 20 is unprotected for a longer time interval than the noncentral portions of the strip 20 because a center cutout 87 of the shield exposes a greater distance along the centerline of strip 20 than is exposed along noncentral portions thereof. Thus the opening in the shield can be designed with many different configurations depending upon the exposure conditions required to suit a particular pattern and a particular forming step.

FIG. 8 is an elevational view drawn schematically to show an etching operation. A reel 67 supplies a strip 20 having a patent image of a pattern thereon. The strip 20 is guided by a guide roller 72 into and through an etching spray chamber 108. The strip 20 is supported by a support bridge 114 to resist the forces of an etchant spray issuing from a spray manifold 112. A shield such as the shield 78 shown in FIG. 7A has an opening through which the etchant spray impinges upon the strip 20 as it is passed under and by the opening. Copper foil surfaces on the strip 20 are exposed to the etchant spray for a time interval which depends upon the strip speed and the length of the opening in the shield 78.

A typical etchant solution, suitable for use in the chamber 108 is available from Phillip A. Hunt Co. of Palisades Park, New Jersey, under the trade designation "Hunts' Hi-Speed Circuit Etch." Such solution typically consists primarily of ferric chloride with wetting agents, defoaming agents and relatively pure water. One such solution 111 is poured into a tank (not shown) in the bottom of the chamber 108 from which it is pumped into spray manifold 112. The spray impinges upon the exposed portion of strip 20 and is caught in the bottom of the chamber 108 from which it is again recirculated.

The time interval needed by the etching solution 111 to suitably etch away unwanted areas in the copper foil can typically range from 0.50 minutes to 1.25 minutes. This interval is usually dependent upon the chemical content of the solution 111, the amount of impurity contained therein, and the temperature of the solution. Therefore, the temperature of the solution 111 is held at about 49° C.±0.5° C. by temperature control means (not shown). Generally a time interval of about 0.75 minutes has been found suitable under these conditions for etching in the practice of this invention.

FIG. 9 is a cross-sectional view of the strip 20 taken along line 6—6 in FIG. 2A after it has gone through the etching step. Coating has previously been removed at areas 32A, 34A and 75 during development and cleaning. Copper foil in areas 32B, 34B and 113 have been removed by the chemicals in the etchant solution acting upon the copper for a suitable time interval to remove the foil in these unwanted areas. Coating at areas 32C, 34C and 109 has been "broken out" by the force of the etchant solution spray which breakout advantageously allows reaction chemical and reaction products to leave these areas and to be replaced by fresher solution.

After the strip 20 exits chamber 108 it is guided over an open support in a rinsing and drying chamber 116. Such open support is similar to the open support 102 shown in FIG. 6. In the rinsing section of chamber 116 relatively pure water is sprayed from a manifold 118 and a manifold 117 upon the top and the bottom of the strip 20. Then forced air from a drying tube section 99 impinges upon and dries the strip 20.

Another useful method of rinsing the strip 20 in the chamber 116 is often employed using immersion and overflow principles. The strip 20 is guided under the surface of a relatively pure bath of water held in a tank (not shown) which has a stream of water constantly flowing therethrough. The rinse water which entrains contaminants is constantly overflowed to a drain while fresh water is constantly being introduced into the tank for rinsing the moving strip 20.

A special set 52 of pinch-drive rollers is disposed about the strip 20 at the outlet of the drying section 99. By reference to FIG. 10 it can be seen that a roller 44 and a roller 54 are arranged in a manner similar to set 43, shown before in FIG. 4A. However, a pair of flanges 50 are spaced closer together because the delineation margin 35 is now separated from the strip 20 and is taken up by other means before it reaches the roller set 52. In addition the bottom roller 52 has a standing edge 56 attached to its drum surface to separate a drive margin 36 from a pattern portion 22 of the strip 20.

It has been found that the drive margin 36, shown in FIG. 10, is very useful to withstand the major amount of force needed to drive strip 20 through a typical forming step. In one example, a force of 500 grams was found necessary to drive the strip 20 through a typical etching step. A drag clutch applied to the feed reel 67, as shown in FIG. 9, applied an additional backward force of 100 grams to keep the strip 20 taut and unwrinkled. This total force was substantially overcome by a force of 400 grams applied by the rollers of pinch-drive set 52 to drive margin 36. Thus, only 150 grams of force were applied to the pattern portion 22 and a mere 50 grams of force was used to take up margin 35.

Referring again to FIG. 8, it can be seen that the delineation margin 35, the drive margin 36 and the pattern portion 22 are taken up and wound upon three respective, separate spools 60, 62 and 63. In addition, another reel 71 is disposed above the reel 63 which reel 63 takes up the pattern portion 22. The reel 71 supplies a protective film 69, typically 0.05 m.m. thick polyester tape supplied under the trade name "Mylar" by E. I. Dupont De Nemours Co., Inc., of Wilmington, Delaware which has been found suitable for the required function. Film 69 is interleaved between layers of the pattern portion 22 on reel 63 to protect the lead clusters in such pattern portion 22. In particular, film 69 prevents the etched edges of the leads from becoming entangled during the winding of pattern portion 22. Of course, pattern portion 22 can be usable as carrier tape with or without further steps such as plating; however, it is customary to at least clean the pattern portion 22 by stripping therefrom the unpolymerized coating which remains after the pattern forming steps are completed.

While the above description has set forth the developing step as being done separately from the etching step, it is highly desirable that these two steps be combined on a continuous basis. To do this the operations shown in FIG. 6 and FIG. 8 are set end-to-end, eliminating the reel 76, shown in FIG. 6 but not necessarily eliminating the roller set 43. Strip 20 is driven directly out of the developing, cleaning and rinsing chambers, 64, 66 and 68 shown in FIG. 6 and into the etching chamber 108 shown in FIG. 8. When the steps are thus combined it is desirable that a controllable speed be selected for driving strip 20. It will be appreciated that a wide range of speeds can be used depending upon the dimensions of the forming chambers and upon the solution circulation flow rates. For the practice of this embodiment of the invention, it has generally been found that a speed of about 48 inches per minute is suitable to drive the strip 20 through this succession of forming steps. Then a shield 78 in chamber 64 and another shield 78, in the chamber 108 are both advantageously adjusted so that the strip 20 is exposed to the respective spray solutions for time intervals which are suitable for the respective forming steps. Thereafter each shield is adjusted from time-to-time to account for changes in the reaction rate of the chemicals in the solutions. It will of course be appreciated that the tape speed, while normally constant, can also be varied to accommodate one or more forming steps.

There have been illustrated herein certain practical embodiments of the invention and certain applications thereof. Nevertheless, it is to be understood that various modifications and refinements may be made and used which differ from these disclosed embodiments without departing from the spirit and scope of the present invention.

What is claimed is:

1. A method of forming a pattern in a strip of metal foil having no substantial resistance to bending, comprising:

driving the strip in a lengthwise direction in a substantially horizontal plane common to the strip;

guiding and supporting the driven strip through a succession of chambers, each having stationary inlet and outlet means for the strip with means therebetween for guidably supporting the strip and means therealong for forming the pattern, said chambers providing a succession of substantially simultaneously operating forming steps to form the pattern in the strip, each step requiring a separate exposure time interval suitable for such forming step; and shielding the strip with means disposed parallel to the horizontal plane of the strip within the confines of a chamber at one or more of the forming steps such that, along a portion of the means for guidably supporting the strip, said strip is shielded from the forming and along a portion of said means the pattern on the strip is exposed for a respective time interval suitable for the said forming step.

2. A method as defined in claim 1, wherein the shielding is done in a stationary manner relative to the driven strip, the shielding being adjustable to vary the exposed length of driven strip, to vary the forming time interval to suit changing forming conditions.

3. A method as defined in claim 1, wherein the strip is shielded on a side of the driven strip upon which forming is directed, the other side being exposed.

4. A method as defined in claim 1, wherein the strip is coated with a light sensitive material having a latent image provided in such coating on the strip and wherein forming the pattern includes the steps of:

developing the latent image of the pattern in the coating to make the pattern patent upon the strip; and cleaning the patent image of the pattern on the strip.

5. A method as defined in claim 4, wherein the exposure time interval suitable for developing is different from the exposure time interval for cleaning the pattern at a strip speed suitable for cleaning the pattern on the driven strip and wherein the strip is shielded at the developing step such that the pattern on the strip is exposed for the time interval suitable for development.

6. A method as defined in claim 5, wherein the shielding is done in a nonuniform on a line transverse to the driven strip, such that at least one central portion of the strip is developed for a time interval different from noncentral portions of the strip.

7. A method as defined in claim 5, wherein forming the pattern further includes the steps of:
  removing unwanted areas in the driven strip by etching away such unwanted areas;
  rinsing the strip;
  drying the strip; and
  winding the strip upon a spool.

8. The method as defined in claim 7, wherein the developing step, the pattern cleaning step, and the etching step are done substantially simultaneously along successive portions of the strip while the strip is being continuously driven therefor.

9. The method as defined in claim 7 or claim 8, wherein the strip is shielded at the etching step such that the pattern in the strip is exposed to the etching for a time interval suitable for etching.

10. The method as defined in claim 7 or claim 8, wherein the strip is unshielded at the developing step and wherein said strip is shielded at the etching step such that the pattern in the strip is exposed to the etching for a time interval suitable for etching.

* * * * *

UNITED STATES PATENT AND TRADEMARK OFFICE
CERTIFICATE OF CORRECTION

PATENT NO. : 4,320,192

DATED : March 16, 1982

INVENTOR(S) : M. T. Gursky, W. W. Pcihoda

It is certified that error appears in the above—identified patent and that said Letters Patent is hereby corrected as shown below:

In the claims, Column 13, Claim 6, line 2, after "nonuniform" insert --manner--.

Signed and Sealed this

Twenty-fifth Day of May 1982

[SEAL]

Attest:

*Attesting Officer*

GERALD J. MOSSINGHOFF

*Commissioner of Patents and Trademarks*